(12) United States Patent
Peng et al.

(10) Patent No.: US 7,492,596 B1
(45) Date of Patent: Feb. 17, 2009

(54) HEAT DISSIPATION DEVICE

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/836,712

(22) Filed: Aug. 9, 2007

(51) Int. Cl.
H05K 7/20 (2006.01)
F28F 7/00 (2006.01)

(52) U.S. Cl. ............... 361/700; 165/80.3; 165/104.33; 361/719

(58) Field of Classification Search ............... 361/700, 361/719
See application file for complete search history.

(56) References Cited

U.S. PATENT DOCUMENTS

| 6,937,474 | B2 | 8/2005 | Lee | |
|---|---|---|---|---|
| 7,019,974 | B2* | 3/2006 | Lee et al. | 361/700 |
| 7,209,356 | B2* | 4/2007 | Lee et al. | 361/719 |
| 7,319,588 | B2* | 1/2008 | Peng et al. | 361/700 |
| 7,327,576 | B2* | 2/2008 | Lee et al. | 361/719 |
| 7,369,412 | B2* | 5/2008 | Peng et al. | 361/715 |
| 2008/0035311 | A1* | 2/2008 | Hsu | 165/104.21 |

* cited by examiner

Primary Examiner—Gregory D Thompson
(74) Attorney, Agent, or Firm—Frank R. Niranjan

(57) ABSTRACT

A heat dissipation device includes a first heat dissipation unit attached to a top surface of the electronic component of an add-on card and defining a channel therein, a heat pipe, and a second heat dissipation unit. The second heat dissipation unit includes a first portion located at a lateral side of the add-on card, a second portion extending from the first portion to a bottom side of the add-on card, and a joint portion formed between the first portion and the second portion and located at the lateral side of the add-on card. The heat pipe includes an evaporating portion received in the channel of the first heat dissipation unit, and a condensing portion extended through the second heat dissipation unit at the joint portion.

12 Claims, 5 Drawing Sheets

HEAT DISSIPATION DEVICE

BACKGROUND OF THE INVENTION

1. Field of the Invention

The present invention relates to a heat dissipation device, and particularly a heat dissipation device mounted onto an add-on card for dissipation heat generated by the add-on card.

2. Description of Related Art

In order to enable desktop and other computers to rapidly process graphics and game data, add-on units, generally referred to as "graphics cards" are often installed in computer devices. Such cards comprise a separate processor, called a GPU (graphics processor unit). The GPU generates a large amount of heat during operation. When the temperature of the GPU exceeds a certain level, the GPU may malfunction, or in the worst case fail outright. For this reason, a heat sink having heat pipe engaged therewith is commonly installed on the GPU to dissipate the heat generated by the GPU and other electronic components adjacent to it into ambient air.

A typical heat sink is manufactured to have a bulk volume with a great height and comprises a base for receiving heat from the GPU and a plurality of fins extending from the base to dissipate the heat to ambient air. A heat pipe generally comprises an evaporating portion engaged with the base and a condensing portion engaged with the fins, to transfer heat from the base to the fins remote from the base. However, it is impractical to install such a large, high-capacity heat sink to the graphics card because the space between the add-on cards is usually so narrow that a heat sink with bulk volume can not be positioned therebetween. This has adversely affected the heat dissipation of the add-on cards.

What is needed is a heat dissipation device which has a better configuration for making use of the space of the add-on card to dissipate heat generated by the electronic component.

SUMMARY OF THE INVENTION

A heat dissipation device in accordance with a preferred embodiment of the present invention includes a first heat dissipation unit attached to a top surface of the electronic component of an add-on card and defining a channel therein, a heat pipe, and a second heat dissipation unit. The second heat dissipation unit includes a first portion located at a lateral side of the add-on card, and a second portion extending from the first portion to a bottom side of the add-on card, and a joint portion formed between the first portion and the second portion and located at the lateral side of the add-on card. The heat pipe includes an evaporating portion received in the channel of the first heat dissipation unit, and a condensing portion extended through the second heat dissipation unit at the joint portion.

Other advantages and novel features will become more apparent from the following detailed description of preferred embodiments when taken in conjunction with the accompanying drawings, in which:

DETAILED DESCRIPTION OF THE INVENTION

Figure 1:
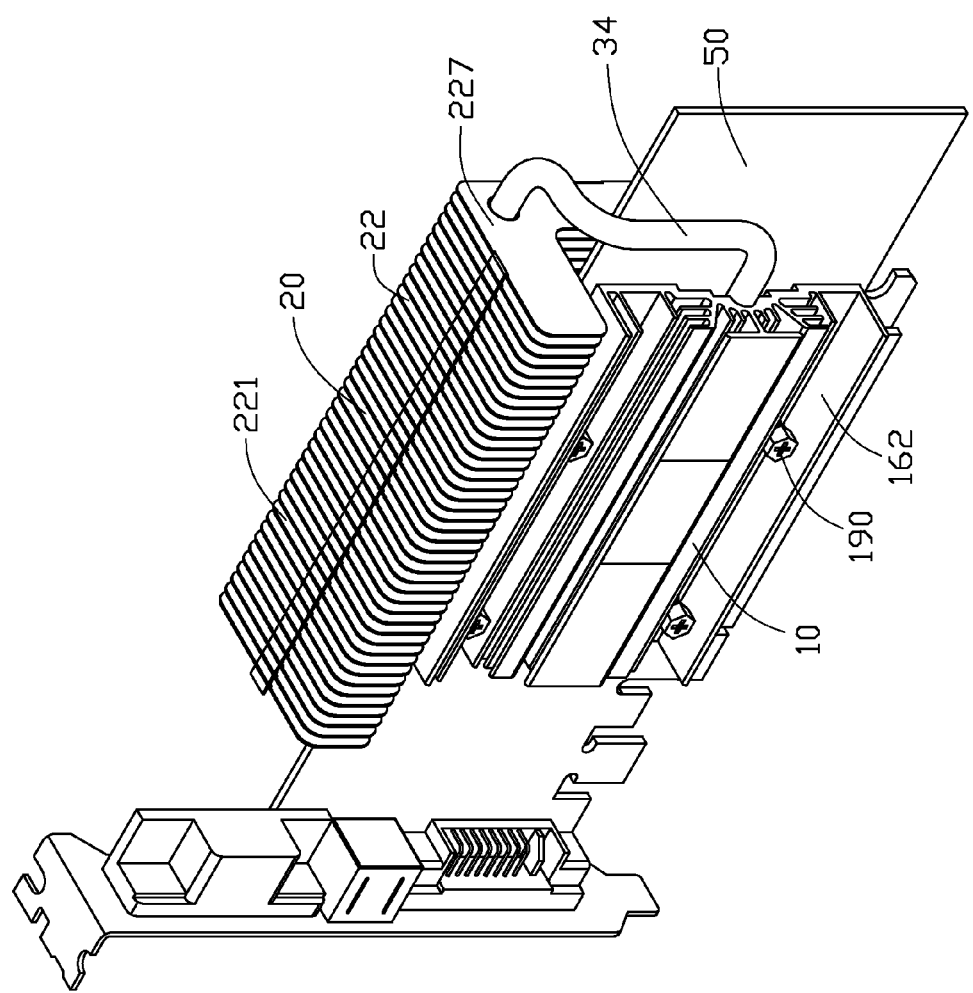
FIG. 1 is an isometric view of a heat dissipation device in accordance with a preferred embodiment of the present invention, the heat dissipation device being assembled to a graphics card.
Figure 2:
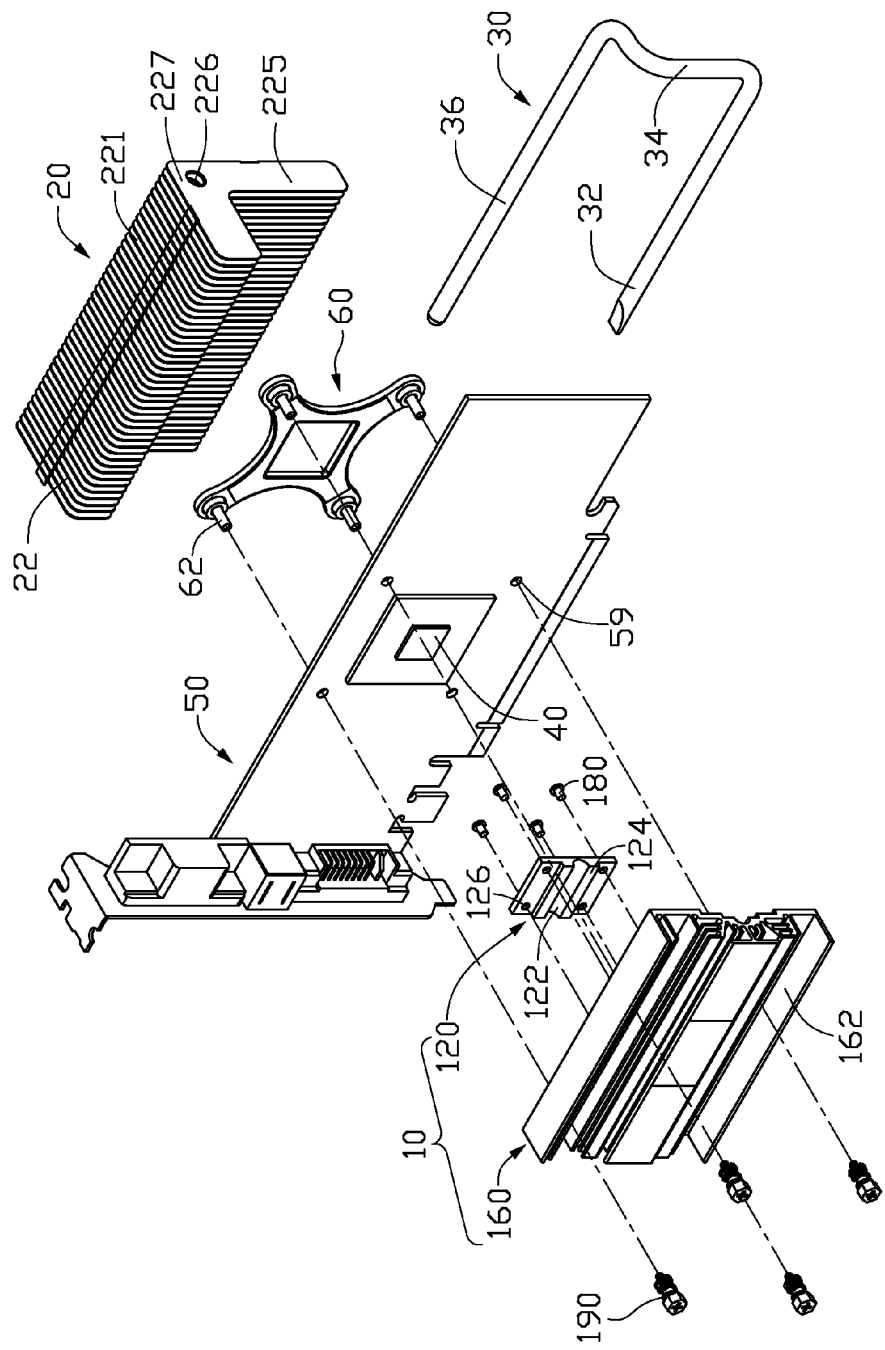
FIG. 2 is an exploded, isometric view of FIG. 1.
Figure 3:
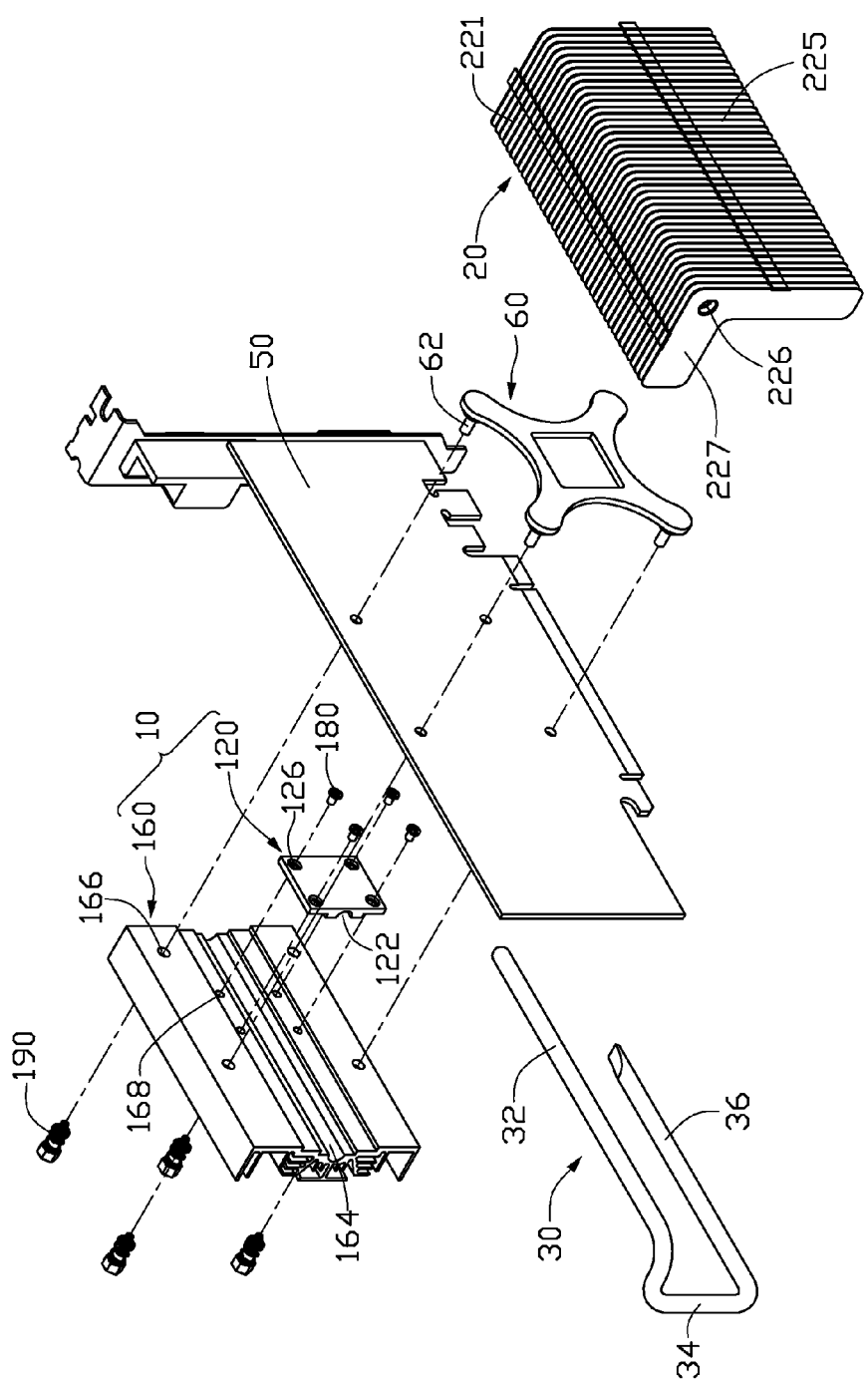
FIG. 3 is similar to FIG. 2, but viewed from a different aspect.

FIGS. 1-3 illustrate a heat dissipation device for dissipating heat generated by an electronic component 40 mounted on a graphics card 50. The heat dissipation device comprises a first heat dissipation unit 10, a second heat dissipation unit 20 and a heat pipe 30 connecting the first and the second heat dissipation units 10, 20 to remove heat from the electronic component 40. The graphics card 50 defines four spaced through holes 59 therein, which surround the electronic component 40.

Particularly referring to FIGS. 2-3, the heat pipe 30 has a U-shaped configuration that comprises an evaporating portion 32, a condensing portion 36 and a connecting portion 34 connecting the evaporating portion 32 to the condensing portion 36.

The first heat dissipation unit 10 comprises a base member 120 attached on a top surface of the electronic component 40, a clamping member 160 engaging with the base member 120 and securing members such as screws 180. The securing members are used to secure the clamping member 160 to the base member 120. The base member 120 is a rectangular metal body. A semicircular groove 122 is formed at a top surface of the base member 120 to receive the evaporating portion 32 of the heat pipe 30; two rectangular protrusions 124 are formed at opposite sides of the groove 122. Four through holes 126 are defined in corners of the base member 120.

The clamping member 160 is formed by aluminum extrusion. The clamping member 160 comprises a plurality of fins 162 formed at a top side thereof and a semicircular groove 164 defined at a bottom side thereof. Four holes 166 are defined in the clamping member 160 and aligned with the associated through holes 59 of the graphics card 50.

The base member 120 is received in a recess (not labeled) defined in the bottom of the clamping member 160. The semicircular groove 164 is located at the central of the recess. Four screw holes 168 are defined in the recess and aligned with the through holes 126. The screws 180 are used to extend through the through holes 126 of the base member 120 and threadedly engage in the screw holes 168 of the clamping member 160. As a result, the clamping member 160 and the base member 120 are assembled together with the evaporating portion 32 of the heat pipe 30 retained in a circular channel defined by the semicircular grooves 122, 164.

The second heat dissipation unit 20 comprises a plurality of parallel fins 22. Each fin 22 is made of a metal sheet, and has an L-shaped configuration. The fins 22 comprise a first portion 221 located at a lateral side of the graphics card 50, and a second portion 225. The second portion 225 perpendicularly extends from a bottom portion of the first portion 221 to a bottom side of the graphics card 50. A joint portion 227 is formed between the first portion 221 and the second portion 225, and located at the lateral side of the graphics card 50. A channel 226 is defined in the joint portion 227, and perpendicularly extends through the fins 22 at the joint portion 227. The condensing portion 36 of the heat pipe 30 is installed in the channel 226. Thus, the evaporating portion 32 of the heat pipe 30 is located above a top side of the graphics card 50, and the condensing portion 36 of the heat pipe 30 is disposed at the lateral side of the graphics card 50. The channel 226 is parallel to the channel defined cooperatively by the grooves 164, 122.

The heat dissipation device further comprises a back plate 60 to reinforce the graphics card 50. The back plate 60 is positioned below the bottom side of the graphics card 50 and above a top surface of the second portion 225 of the fins 22. The back plate 60 is cross-shaped and defines four nuts 62 therein. The nuts 62 extend through the through holes 59 of the graphics card 50 from the bottom side thereof. Four screws 190 extend through the through holes 166 of the clamping member 160 to threadedly engage with the nuts 62 to thereby fasten the clamping member 160 together with the base member 120 and the back plate 60 to the graphics card 50. Thus, the heat dissipation device is mounted to the graphics card 50. Four partition gaskets are fixed between the graphics card 50 and the back plate 60 to prevent a physical contact between the back plate 60 and the graphics card 50 so that the back plate 60 is electrically insulated from the graphic card 50.

After the heat dissipation device is mounted to the graphics card 50, the bottom surface of the base member 120 contact with the top surface of the electronic component 40. Simultaneously, the evaporating portion 32 of the heat pipe 30 is fittingly received in the channel defined by the groove 164 of the clamping member 160 and the groove 122 of the base member 120. The condensing portion 36 of the heat pipe 30 is fittingly received in the channel 226 of the joint portion 227 of the fins 22. Therefore, the heat pipe 30 is able to transfer heat from the first heat dissipation unit 10, which is attached on the electronic component 40, to the joint portion 272 of the second heat dissipation unit 20 which is separate from the electronic component 40.

Figure 4:
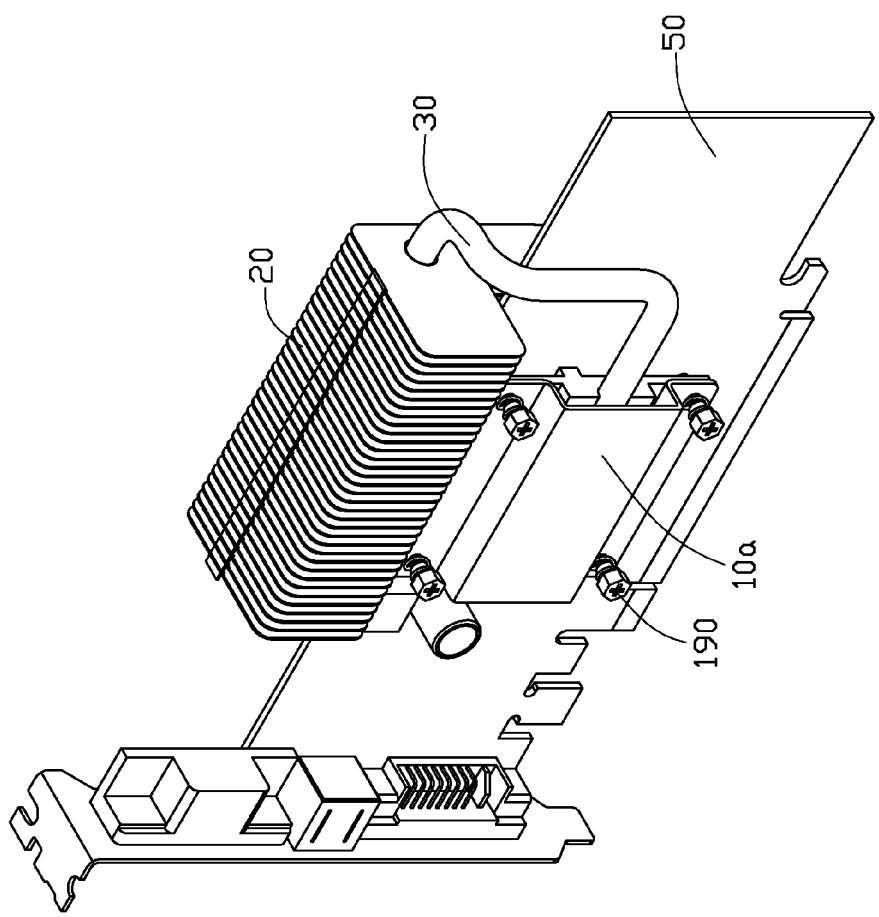
FIG. 4 is an isometric view of a heat dissipation device in accordance with an another embodiment of the present invention, the heat dissipation device being assembled to a graphics card.
Figure 5:
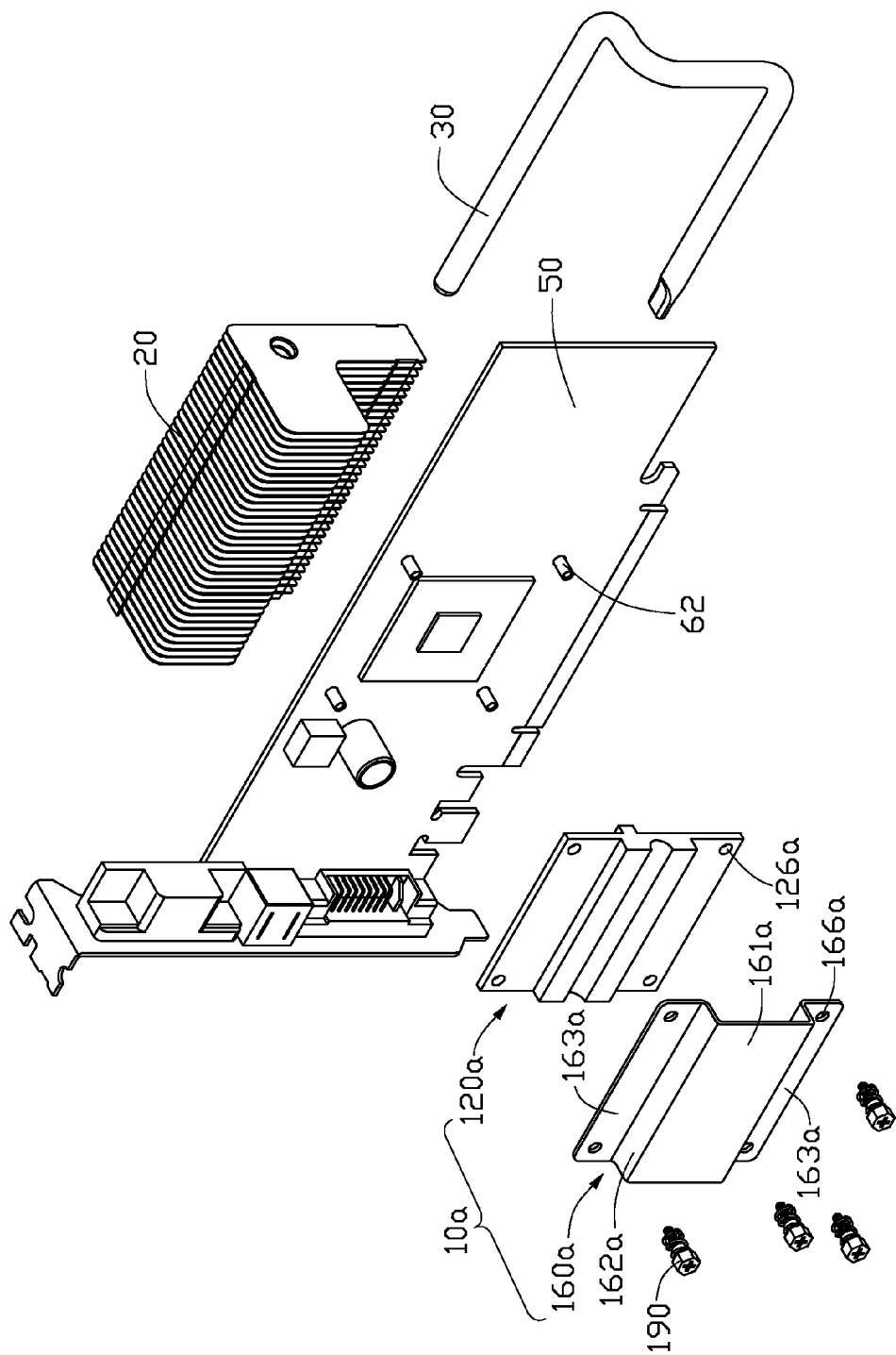
FIG. 5 is an exploded, isometric view of FIG. 4.

Referring to FIGS. 4-5, a heat dissipation device in accordance with another embodiment of the present invention is illustrated. This heat dissipation device is similar to the previous heat dissipation device, and also includes a heat pipe 30 and a second heat dissipation unit 20. The heat dissipation device further comprises a first heat dissipation unit 10*a* different from the first heat dissipation unit 10. The first heat dissipation unit 10*a* includes a base member 120*a* similar to the base member 120 of the previous heat dissipation device, and a clamping member 160*a*. The clamping member 160*a* includes a top portion 161*a* and two side portions 162*a* extending downwardly from opposite sides of the top portion 161*a*. The clamping member 160*a* further includes two connecting portions 163*a* extending perpendicularly and outwardly from ends of the side portions 162*a*, respectively. A semicircular groove is defined at a top side of the base member 120*a*. The clamping member 160*a* and the semicircular groove commonly define the channel of the first heat dissipation unit 10*a* to receive the evaporating portion 32 of the heat pipe 30. Four through holes 166*a* are defined in the connecting portions 163*a* at corners of the clamping member 160*a*. Four screws 190 extend through the through holes 166*a* of the clamping member 160*a* and the through holes 126*a* of the base member 120*a* to threadedly engage with the nuts 62 of the back plate 60, to thereby secure the first heat dissipation unit 10*a* to the graphics card 50 in a manner similar to that regarding the previous heat dissipation device.

Other features of the heat dissipation device in accordance with the second embodiment are similar to those of the previous embodiment and can be referenced from the description of the heat dissipation device in accordance with the previous embodiment.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for dissipating heat generated by an electronic component mounted on an add-on card, the heat dissipation device comprising:
   a first heat dissipation unit attached to a top surface of the electronic component and defining a channel therein;
   a second heat dissipation unit comprising a first portion located at a lateral side of the add-on card, a second portion extending from the first portion to a bottom side of the add-on card, and a joint portion formed between the first portion and the second portion and located at the lateral side of the add-on card; and
   a heat pipe comprising an evaporating portion received in the channel of the first heat dissipation unit, and a condensing portion extended through the second heat dissipation unit at the joint portion;
   wherein the first heat dissipation unit comprises a base member and a clamping member positioned on the base member; and
   wherein the base member defines a semicircular groove at a top side thereof, and the clamping member and the semicircular groove of the base together defining the channel of the first heat dissipation unit.

2. The heat dissipation device as claimed in claim 1, wherein the second heat dissipation unit comprises a plurality of fins and each of the fins is L-shaped.

3. The heat dissipation device as claimed in claim 2, wherein a channel is defined in and extends through the joint portion, and the condensing portion of the heat pipe is retained in the channel.

4. The heat dissipation device as claimed in claim 1, wherein the channel defined in the first heat dissipation unit is parallel to the joint portion of the second heat dissipation unit.

5. The heat dissipation device as claimed in claim 4, wherein the heat pipe is U-shaped.

6. The heat dissipation device as claimed in claim 5 further comprising a back plate located between the add-on card and the second portion of the second heat dissipation unit.

7. The heat dissipation device as claimed in claim 6 further comprising screws that extend trough through holes of the clamping member to threadedly engage with the back plate to thereby mount the heat dissipation device to the add-on card.

8. An electronic assembly comprising:
   a board having a first surface and a second surface opposite to the first surface;
   an electronic component mounted on the first surface of the board; and
   a heat dissipation device comprising:
   a first heat dissipation unit located above the first surface of the board and in thermally engagement with the electronic component;
   a second heat dissipation unit comprising a first portion located at a lateral side of the board, a second portion extending from the first portion, and a joint portion defined between the first portion and the second portion and located at the lateral side of the board; and
   a heat pipe comprising an evaporating portion thermally connected with the first heat dissipation unit and a condensing portion thermally connected with the second heat dissipation unit at the joint portion;
   wherein the first heat dissipation unit has a base member thermally connecting with the electronic component, a clamping member, and screws threadedly connecting the clamping member and the base member together, the evaporating portion of the heat pipe being sandwiched between the clamping member and the base member, and the second heat dissipation unit having the second portion extending from the first portion to a bottom side of the add-on card.

9. The electronic assembly as claimed in claim 8, wherein the first heat dissipation unit defines a channel receiving the evaporating portion of the heat pipe and the second heat dissipation unit defines a channel receiving the condensing portion of the heat pipe, and the two channels are parallel to each other.

10. The electronic assembly as claimed in claim 8, wherein the second heat dissipation unit comprises a plurality of fins and each of the fins is L-shaped.

11. The electronic assembly as claimed in claim 9, wherein the heat pipe is U-shaped.

12. A heat dissipation device for dissipating heat generated by an electronic component mounted on an add-on card, the heat dissipation device comprising:

a first heat dissipation unit attached to a top surface of the electronic component and defining a channel therein;

a second heat dissipation unit comprising a first portion located at a lateral side of the add-on card, a second portion extending from the first portion to a bottom side of the add-on card, and a joint portion formed between the first portion and the second portion and located at the lateral side of the add-on card; and a heat pipe comprising an evaporating portion received in the channel of the first heat dissipation unit, and a condensing portion extended through the second heat dissipation unit at the joint portion;

wherein the first heat dissipation unit comprises a base member and a clamping member positioned on the base member; and wherein the base member defines a semicircular groove at a top side thereof, and the clamping member defines a semicircular groove at a bottom side thereof, the semicircular groove of the base member and the semicircular groove of the clamping member together defining the channel of the first heat dissipation unit.

* * * * *